United States Patent
Kobayashi et al.

(10) Patent No.: US 9,881,961 B2
(45) Date of Patent: Jan. 30, 2018

(54) SOLID-STATE IMAGING DEVICE

(71) Applicant: Panasonic Intellectual Property Management Co., Ltd., Osaka (JP)

(72) Inventors: Hiroyuki Kobayashi, Osaka (JP); Takahiro Muroshima, Kyoto (JP); Hiroshi Toya, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 10 days.

(21) Appl. No.: 14/828,467

(22) Filed: Aug. 17, 2015

(65) Prior Publication Data

US 2015/0357369 A1  Dec. 10, 2015

Related U.S. Application Data

(63) Continuation of application No. PCT/JP2014/000422, filed on Jan. 28, 2014.

(30) Foreign Application Priority Data

Feb. 21, 2013  (JP) ................. 2013-032636

(51) Int. Cl.
*H01L 27/146* (2006.01)
*H04N 5/357* (2011.01)
*H04N 5/378* (2011.01)

(52) U.S. Cl.
CPC .. *H01L 27/14643* (2013.01); *H01L 27/14636* (2013.01); *H01L 27/14638* (2013.01);
(Continued)

(58) Field of Classification Search
CPC ........ H04N 5/357; H04N 5/361; H04N 5/378; H04N 5/369; H01L 27/14643;
(Continued)

(56) References Cited

U.S. PATENT DOCUMENTS 7,355,645 B2  4/2008  Sakurai et al.
7,986,362 B2  7/2011  Sakurai et al.
(Continued)

FOREIGN PATENT DOCUMENTS

JP  2003-032548 A  1/2003
JP  2004-088158 A  3/2004
(Continued)

OTHER PUBLICATIONS

Search Report dated Apr. 28, 2014 issued in International Patent Application No. PCT/JP2014/000422 (English translation).

*Primary Examiner* — John Lee
(74) *Attorney, Agent, or Firm* — McDermott Will & Emery LLP

(57) ABSTRACT

A solid-state imaging device according to an aspect of the present invention includes: an imaging area including a plurality of pixels arranged in rows and columns, each of the plurality of pixels converting incident light into a pixel signal; a column signal line provided for each of the columns, for reading out the pixel signal; and a current source connected to the column signal line, in which the current source includes: three transistors connected in series and provided between the column signal line and a GND line; and a transistor having a drain and a source each of which is connected to a different one of connection points connecting adjacent ones of the three transistors.

6 Claims, 9 Drawing Sheets

(52) U.S. Cl.
CPC ....... *H01L 27/14641* (2013.01); *H04N 5/357* (2013.01); *H04N 5/378* (2013.01)

(58) Field of Classification Search
CPC ......... H01L 27/14636; H01L 27/14638; H01L 27/14641; H01L 27/14609; H01L 27/14601; H01L 27/146
See application file for complete search history.

(56) References Cited

U.S. PATENT DOCUMENTS

| | | | |
|---|---|---|---|
| 8,189,082 B2 | 5/2012 | Matsuura | |
| 8,520,107 B2 | 8/2013 | Nishimura et al. | |
| 8,553,120 B2 | 10/2013 | Sakurai et al. | |
| 9,055,211 B2 | 6/2015 | Sakurai et al. | |
| 2003/0011831 A1 | 1/2003 | Sakurai et al. | |
| 2004/0070578 A1 | 4/2004 | Kasai | |
| 2004/0165093 A1* | 8/2004 | Dosluoglu | H04N 3/1568 348/308 |
| 2005/0007353 A1* | 1/2005 | Smith | G09G 3/3233 345/204 |
| 2005/0018065 A1* | 1/2005 | Tashiro | H01L 27/14658 348/308 |
| 2007/0145240 A1* | 6/2007 | Lee | H04N 5/3658 250/208.1 |
| 2007/0146514 A1* | 6/2007 | Maeda | H04N 5/3456 348/294 |
| 2008/0012976 A1 | 1/2008 | Sakurai et al. | |
| 2008/0055432 A1* | 3/2008 | Koseki | H04N 5/3658 348/241 |
| 2010/0020217 A1* | 1/2010 | Abe | H04N 5/3591 348/308 |
| 2010/0053389 A1 | 3/2010 | Matsuura | |
| 2011/0242382 A1 | 10/2011 | Sakurai et al. | |
| 2011/0254960 A1* | 10/2011 | Seger | H04N 5/2351 348/175 |
| 2011/0254986 A1 | 10/2011 | Nishimura et al. | |
| 2011/0273601 A1* | 11/2011 | Egawa | H04N 5/37457 348/300 |
| 2012/0006973 A1* | 1/2012 | Storm | H04N 5/3575 250/208.1 |
| 2012/0074956 A1* | 3/2012 | Fife | G01N 27/4148 324/612 |
| 2012/0194715 A1* | 8/2012 | Skaug | H04N 5/351 348/300 |
| 2013/0021839 A1* | 1/2013 | Ishikura | G11C 11/412 365/154 |
| 2013/0038760 A1* | 2/2013 | Blanquart | H04N 5/365 348/241 |
| 2013/0087685 A1* | 4/2013 | Itano | H04N 5/3572 250/208.1 |
| 2013/0147996 A1* | 6/2013 | Minowa | H04N 5/3597 348/301 |
| 2013/0302932 A1* | 11/2013 | Bustillo | G01N 27/4145 438/49 |
| 2014/0002689 A1 | 1/2014 | Sakurai et al. | |
| 2014/0183338 A1* | 7/2014 | Fossum | G01S 17/89 250/208.1 |
| 2015/0357369 A1* | 12/2015 | Kobayashi | H04N 5/378 250/208.1 |
| 2016/0141327 A1* | 5/2016 | Verdant | H01L 27/14612 250/208.1 |
| 2016/0178570 A1* | 6/2016 | Fife | G01N 27/4148 257/253 |
| 2016/0249002 A1* | 8/2016 | Kim | H04N 5/3745 |

FOREIGN PATENT DOCUMENTS

| | | |
|---|---|---|
| JP | 2006-279469 A | 10/2006 |
| JP | 2008-022259 A | 1/2008 |
| JP | 2010-056965 A | 3/2010 |
| WO | 2011/030391 A1 | 3/2011 |

* cited by examiner

SOLID-STATE IMAGING DEVICE

CROSS REFERENCE TO RELATED APPLICATIONS

This is a continuation application of PCT International Application No. PCT/JP2014/000422 filed on Jan. 28, 2014, designating the United States of America, which is based on and claims priority of Japanese Patent Application No. 2013-032636 filed on Feb. 21, 2013. The entire disclosures of the above-identified applications, including the specifications, drawings and claims are incorporated herein by reference in their entirety.

FIELD

The present invention is related to solid-state imaging devices.

BACKGROUND

In recent years, metal oxide semiconductor (MOS) imaging sensors have been developed as solid-state imaging devices suitable for use in digital still cameras, smartphones, or others. In particular, there is a growing need for higher frame rates, for example, in order to support video recording, and various high-speed techniques have been proposed for each of the elements included in the MOS imaging sensors.

Patent Literature (PTL) 1 discloses a conventional technique for high-speed transmission of an analog signal in a column signal line.

CITATION LIST

Patent Literature

[PTL 1] Japanese Unexamined Patent Application Publication No. 2008-22259

SUMMARY

Technical Problem

In the conventional technique disclosed in PTL 1, one transistor is connected to a column signal line, and a pulse signal is provided to this transistor. In this way, the current capability of the column signal line is temporarily enhanced in transfer of an optical signal, and thus charge carriers are promptly moved out of the column signal line, thereby providing high-speed transmission of an analog image signal.

Meanwhile, in addition to the high-speed signal transmission, the capability of capturing a relatively dark scene such as an indoor or night scene is now drawing attention.

Unfortunately, the conventional technique disclosed in PTL 1 provides an output signal by greatly amplifying the image signal in a post process to achieve the capturing of the dark scene. When the greatly amplified image signal is outputted, small noise becomes visible. Accordingly, the conventional technique disclosed in PTL 1 fails to achieve both characteristics, i.e. the high frame rate and the low noise, at a high level at the same time.

In view of the foregoing disadvantage, one non-limiting and exemplary embodiment provides a solid-state imaging device that achieves both the high frame rate and the low noise at the same time.

Solution to Problem

In order to overcome the foregoing disadvantage, a solid-state imaging device according to an aspect of the present invention includes: an imaging unit including a plurality of pixels arranged in rows and columns, each of the plurality of pixels converting incident light into a pixel signal; a column signal line provided for each of the columns, for reading out the pixel signal; and a current source connected to the column signal line, in which the current source includes: a plurality of first transistors connected in series and provided between the column signal line and a reference potential line, the plurality of first transistors comprising at least three first transistors; and a second transistor having a first terminal, a second terminal, and a first control terminal, each of the first terminal and the second terminal being connected to a different one of connection points connecting adjacent ones of the plurality of first transistors.

With this, at least one of the series-connected first transistors in the current source, which is not located at either end of the series-connected first transistors, can be short-circuited by the second transistor. Accordingly, at a time when a pixel signal is outputted from the pixel to the column signal line, it is possible to increase an amount of current flowing through the column signal line so as to rapidly change the potential of the column signal line to a potential according to the pixel signal. It is also possible to cancel the variation of bias voltage provided to the control terminals of the first transistors. Thus, the high-speed transmission in the column signal line can be achieved while suppressing the bias noise. Therefore, it is possible to achieve both the high frame rate and the low noise at the same time. Furthermore, at a time when the pixel signal is outputted from the pixel to the column signal line, an increase in the amount of current flowing through the column signal line is temporary, and thus an increase in power consumption can be minimized.

Furthermore, for example, the current source further includes a third transistor disposed in series between the column signal line and the plurality of first transistors, the third transistor having a gate terminal to which a predetermined bias voltage is applied.

Furthermore, for example, each of the plurality of first transistors has a third terminal, a fourth terminal, and a second control terminal for controlling conduction between the third terminal and the fourth terminal, and the solid-state imaging device further includes: a bias generator that provides a predetermined bias voltage to the second control terminal; and a bias line connecting the bias generator and the second control terminal.

Furthermore, for example, each of the plurality of pixels includes: a photoelectric conversion unit that converts the incident light into signal charge; a transfer transistor that transfers the signal charge generated in the photoelectric conversion unit; a charge accumulation unit that accumulates the signal charge transferred by the transfer transistor; a reset transistor that allows discharge of the signal charge accumulated in the charge accumulation unit; and an amplifier transistor that converts the signal charge accumulated in the charge accumulation unit into a voltage and provides the voltage to the column signal line as the pixel signal.

Furthermore, for example, the solid-state imaging device further includes a timing controller that provides a control signal for allowing conduction between the first terminal and the second terminal of the second transistor to the first control terminal at a time when the pixel signal is outputted to the column signal line.

Advantageous Effects

With a solid-state imaging device according to an aspect of the present invention, it is possible to achieve the high-speed transmission in the column signal line without an increase in power consumption while suppressing the bias noise. Accordingly, the solid-state imaging device that achieves both the high frame rate and the low noise at the same time can be provided.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENT

In the next sections, the configuration and behavior of a solid-state imaging device according to the present embodiment are described with reference to the drawings.
<Configuration of Solid-State Imaging Device Acceding to Embodiment>

Figure 1:
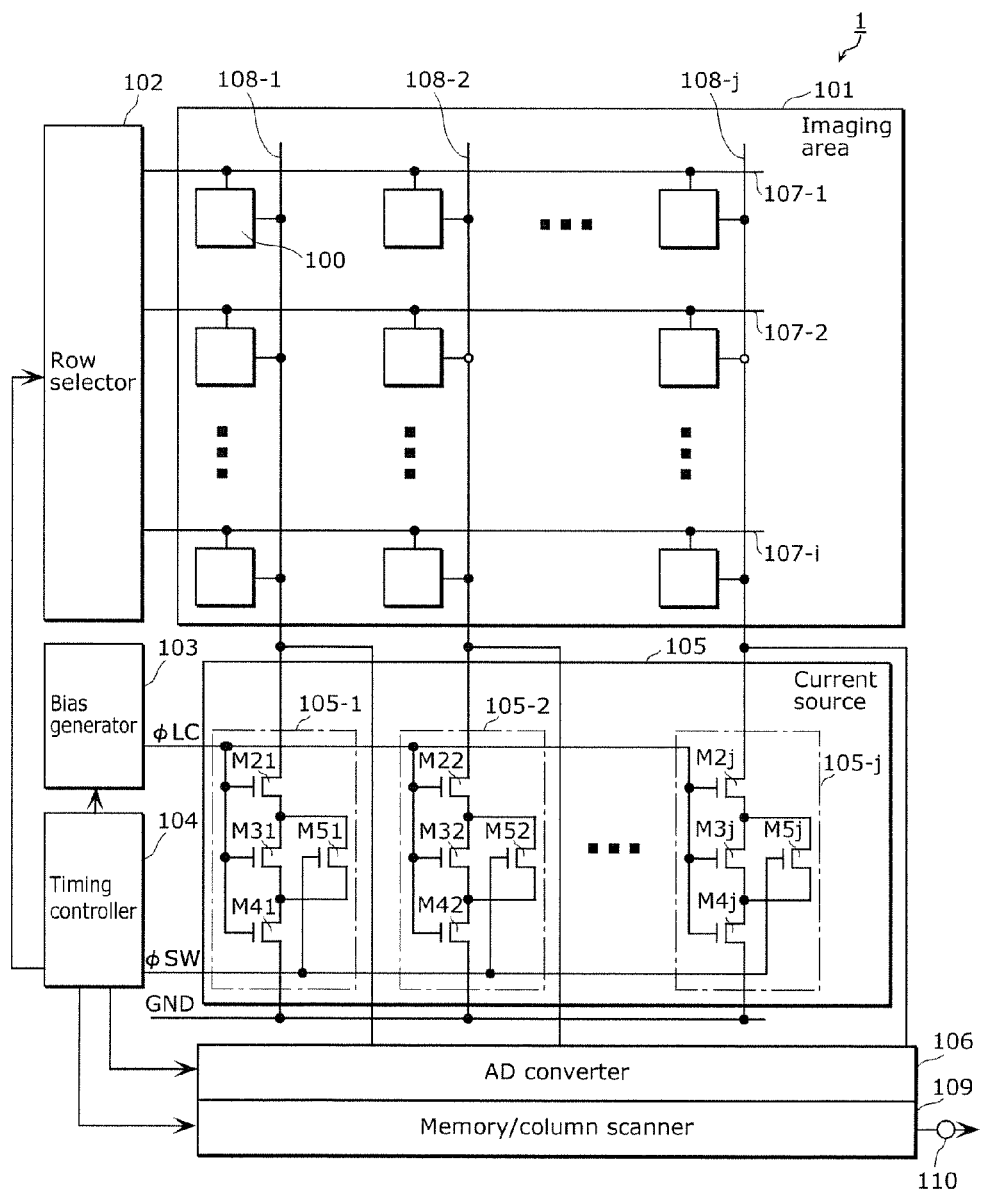
FIG. 1 illustrates a functional block diagram showing an overall configuration of a solid-state imaging device according to an embodiment.
Figure 2:
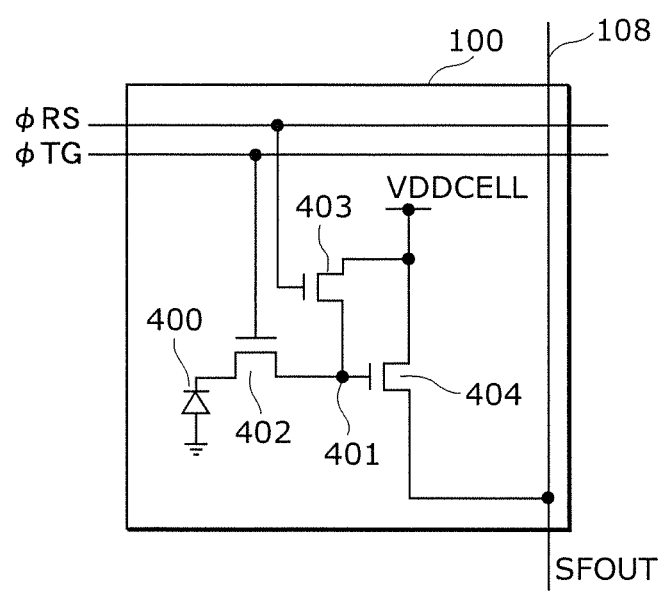
FIG. 2 illustrates a circuit diagram of a pixel (a unit cell) included in the solid-state imaging device according to the embodiment.

FIG. 1 illustrates a functional block diagram showing an overall configuration of the solid-state imaging device according to an embodiment. FIG. 2 illustrates a circuit diagram of a pixel (a unit cell) included in the solid-state imaging device according to the embodiment.

As shown in FIG. 1, the solid-state imaging device 1 includes: an imaging area 101 having pixels (unit cells) 100 arranged in i rows and j columns (each of i and j is a given natural number); a row selector 102; a bias generator 103; a timing controller 104; a current source 105; an AD converter 106; a memory/column scanner 109; and an external output terminal 110. The imaging area 101 is an imaging unit including a plurality of pixels 100 arranged in rows and columns, each of which converts incident light into a pixel signal. The current source 105 includes column current sources 105-1 to 105-j provided in the respective columns.

Furthermore, as shown in FIG. 2, the pixel 100 includes a photo diode 400, a transfer transistor 402, a FD 401, a reset transistor 403, and an amplifier transistor 404.

The photo diode 400 is a photoelectric conversion unit that converts the incident light into signal charge. The transfer transistor 402 transfers signal charge generated in the photo diode 400 to a floating diffusion 401 (hereinafter referred to as "FD"). The FD 401 is a charge accumulation unit that accumulates the signal charge transferred by the transfer transistor 402. The reset transistor 403 allows discharge of the signal charge in the FD 401. The amplifier transistor 404 converts the signal charge in the FD 401 into a voltage according to an amount of charge (a gate potential) and provides the voltage to the column signal line 108 as an analog signal.

It is to be noted that the pixel 100 shown in FIG. 2 may include, in addition to the foregoing structural elements, a selection transistor for selecting a pixel, disposed between the amplifier transistor 404 and the column signal line 108.

Alternatively, the pixel 100 may have a configuration in which plural sets each having a photo diode 400 and a transfer transistor 402 are connected to the same FD 401 and share the reset transistor 403 and the amplifier transistor 404.

As shown in FIG. 1, the imaging area 101 includes pixels 100 arranged in a matrix of i rows and j columns, i row-selection lines 107 (107-1 to 107-$i$), and j column signal lines 108 (108-1 to 108-$j$). For example, the pixel 100 in the x-th row and the y-th column (each of x and y is a given natural number) is connected to the row-selection line 107-$x$ and the column signal line 108-$y$. Hereinafter, when any of the row-selection lines 107-1 to 107-$i$ is described without specifying a particular row-selection line, the any of the row-selection lines may be simply represented as a row-selection line 107. Furthermore, the same is true for the column signal lines 108-1 to 108-$j$, and any of the column signal lines may be simply represented as a column signal line 108 when the any of the column signal lines is described.

The column signal line 108 is provided corresponding to the column of pixels 100, and transmits, to the AD converter 106, analog signals outputted from pixels 100 in the corresponding column. In other words, the column signal line 108 is provided for each of the columns of pixels, and for reading out a pixel signal which is an analog signal.

The row-selection line 107 is provided corresponding to the row of pixels 100, and transmits, to pixels 100 in the corresponding row, a drive signal provided from the row selector 102 (a reset signal φRS and a transfer signal φTG). The drive signal is a signal for driving a pixel 100 in the corresponding row.

The row selector 102 is a row scan unit that scans pixels 100 on a row basis in the column direction to select a row including pixels 100 from each of which the analog signal is to be outputted to the column signal line 108.

The bias generator 103 provides a bias voltage φLC to the column current sources 105-1 to 105-$j$.

The timing controller 104 generates various internal clocks based on a master clock, data, and others, provided via an external terminal or the like, to control the row selector 102, the AD converter 106, the memory/column scanner 109, and others.

Furthermore, the AD converter 106 is an AD conversion unit that converts the analog signal outputted from the pixel 100 into a digital signal and provides the digital signal to the memory/column scanner 109.

The memory/column scanner 109 is a column scan unit that controls the digital signal output of the AD converter 106, and sequentially provides the digital signal receiving from the AD converter 106, to exterior circuitry via the external output terminal 110.

The column current sources 105-1 to 105-j are included in the current source 105 and connected to the column signal lines 108-1 to 108-j to drive currents of the column signal lines 108-1 to 108-j, respectively. All of the column current sources 105-1 to 105-j have the same configuration. Hereinafter, when any of the column current sources 105-1 to 105-j is described without specifying a particular column current source, the any of the column current sources may be simply represented as a current source 105.

Each of the column current sources includes four transistors. The column current source 105-y disposed in the y-th column (1≤y≤j) includes transistors M2y, M3y, M4y, and M5y. The transistors M2y, M3y, and M4y are plural first transistors connected in series in this order and disposed between the column signal line 108-y and a GND line serving as a reference potential line. Furthermore, the transistor M5y is connected in parallel to the transistor M3y. In other words, the transistor M5y is the second transistor having: the first terminal serving as the drain connected to a connection point connecting adjacent transistors M2y and M3y; the second terminal serving as the source connected to a connection point connecting adjacent transistors M3y and M4y; and the first control terminal. The bias voltage φLC is applied to the gates implemented as the second control terminals of the transistors M2y, M3y, and M4y. A control signal φSW is applied to the gate of the transistor M5y. When the control signal φSW becomes the "H" level, the transistor M5y turns ON. Accordingly, the transistor M3y is short-circuited between the source and the drain thereof, thereby increasing the current flowing through the column signal line 108-y.

The external output terminal 110 is a terminal for transmitting, to exterior circuitry, the digital signal outputted by the memory/column scanner 109.

<Configuration and Behavior of General Solid-State Imaging Device>

In this section, a general solid-state imaging device is described with reference to the drawings for the sake of better understanding of the solid-state imaging device according to the present embodiment.

Figure 3:
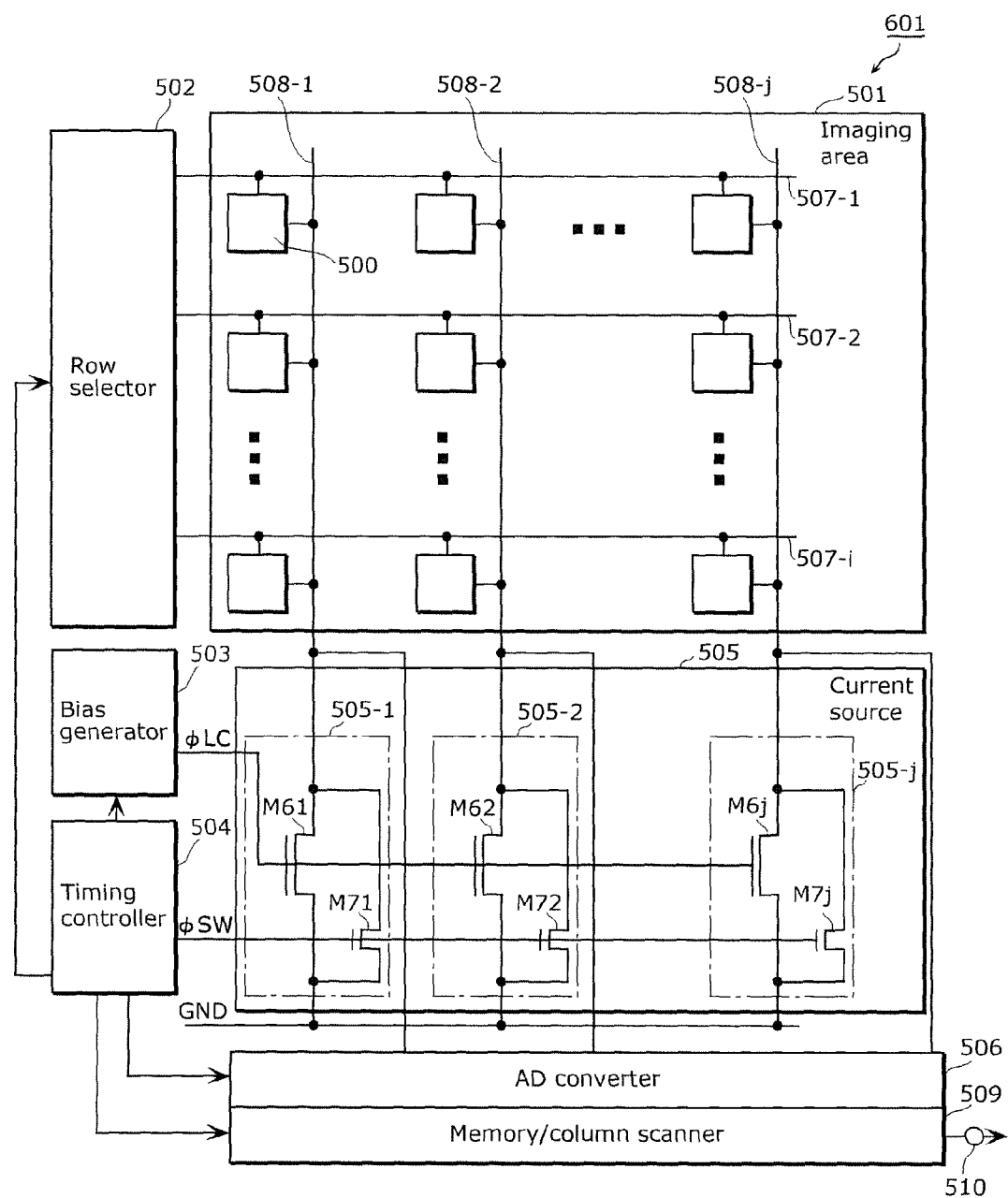
FIG. 3 illustrates a functional block diagram showing an overall configuration of a general solid-state imaging device.

FIG. 3 illustrates a functional block diagram showing an overall configuration of a general solid-state imaging device (MOS image sensor). The solid-state imaging device 601 includes: an imaging area 501 having pixels (unit cells) 500 arranged in a matrix of i rows and j columns (each of i and j is a given natural number); a row selector 502; a bias generator 503; a timing controller 504; a current source 505; an AD converter 506; a memory/column scanner 509; and an external output terminal 510. The current source 505 includes column current sources 505-1 to 505-j provided in the respective columns.

The configuration of the pixel 500 is the same as that of the pixel 100 according to the embodiment as shown in FIG. 2. In other words, the pixel 500 includes: a photo diode 400 that converts light into charge; a FD 401; a transfer transistor 402 that transfers the charge accumulated in the photo diode to the FD 401; an amplifier transistor 404 that converts the charge accumulated in the FD 401 into a voltage signal; and a reset transistor 403 that allows the discharge of the charge accumulated in the FD 401 to a power source.

The column current sources 505-1 to 505-j are connected to the column signal lines 508-1 to 508-j to drive currents of the column signal lines 508-1 to 508-j, respectively. All of the column current sources 505-1 to 505-j have the same configuration.

Each of the column current sources includes two transistors. The column current source 505-y disposed in the y-th column (1≤y≤j) includes transistors M6y and M7y. The transistor M6y is connected between the column signal line 508-y and GND, and the transistor M7y is connected in parallel to the transistor M6y. A bias voltage φLC is applied to the gate of the transistor M6y. A control signal φSW is applied to the gate of the transistor M7y. When the control signal φSW becomes the "H" level, the transistor M7y turns ON. Accordingly, the transistor M6y is short-circuited between the source and the drain thereof, thereby increasing the current flowing through the column signal line 508-y.

Figure 4:
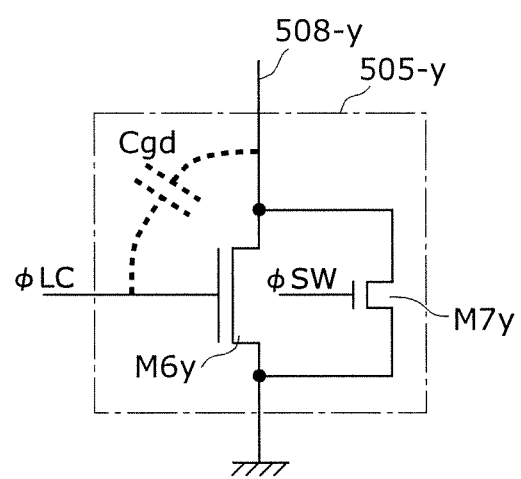
FIG. 4 illustrates a circuit diagram of a column current source included in the general solid-state imaging device.
Figure 5:
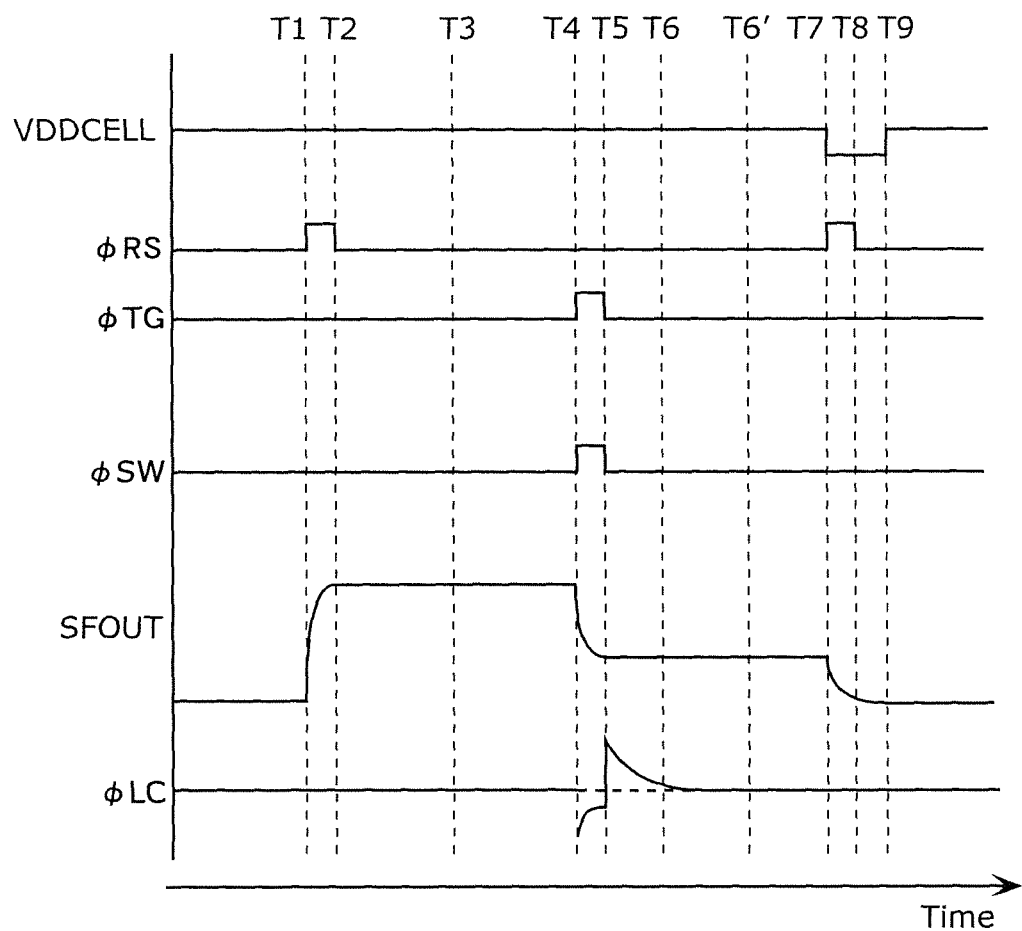
FIG. 5 illustrates a timing chart showing the behavior of the general solid-state imaging device.

FIG. 4 illustrates a circuit diagram of the column current source included in the general solid-state imaging device. The column current source 505-y includes the transistor M6y biased by a constant gate voltage. FIG. 5 illustrates a timing chart showing the behavior of the general solid-state imaging device. In FIG. 5, VDDCELL represents a supply voltage applied to the drains of the reset transistor 403 and the amplifier transistor 404 in the pixel 500. A reset signal φRS represents a signal provided to the gate of the reset transistor 403 in the pixel 500. A transfer signal φTG represents a signal provided to the gate of the transfer transistor 402 in the pixel 500. An analog signal SFOUT represents a potential of the column signal line 508. A control signal φSW represents a signal provided to the gate of the transistor M7y in the current source 505.

The following describes in detail the behavior of the general solid-state imaging device until an optical signal is read out.

First, at the time T1, the row selector 502 provides the reset signal φRS to the reset transistor 403 in the pixel 500. Accordingly, the potential of the FD 401 is set to a predetermined value, and a reset pixel signal according to the predetermined value is outputted to the column signal line 508 as the analog signal SFOUT.

Next, at the time T3, the AD converter 506 captures the reset pixel signal.

Next, during a period between the time T4 and the time T5, the row selector 502 turns on the transfer transistor 402 by changing the transfer signal φTG from the "L" level to the "H" level. Accordingly, signal charge corresponding to an amount of light received by the photo diode 400 is transferred from the photo diode 400 to the FD 401. Then, the optical signal (an imaging signal) according to the resultant potential of the FD 401 is outputted as the analog signal SFOUT.

Furthermore, during the period between the time T4 and the time T5, the timing controller 504 provides, to the current source 505, the control signal φSW having a predetermined voltage level to temporarily increase the current flowing through the column signal line 508. Accordingly, at the time T4, the current flowing through the column signal line 508 is rapidly increased, thereby increasing the gate-source voltage of the amplifier transistor 404 in the pixel 500. As a result, the potential of the source of the amplifier transistor 404, i.e. the potential of the column signal line 508, is lower than that of the case where the control signal φSW having the predetermined voltage level is not provided to the current source 505. Due to this lower potential of the column signal line 508 and coupling between the drain (the column signal line 508-y) and the gate of the transistor M6y through the parasitic capacitance Cgd as shown in FIG. 4, the bias voltage φLC of the transistor M6y is dropped at the time T4. In contrast, at the time T5, the timing controller 504 rapidly stops providing the control signal φSW having the predetermined voltage level. Accordingly, the amount of the current flowing through the column signal line 508 goes back to the normal level, and thus the potential of the column signal line 508 is changed from a low level to a high level. Due to the increase in potential of the column signal line 508 and the foregoing coupling, the bias voltage φLC is raised at the time T5.

After the transfer of the optical signal in the pixel 500, it is desirable to convert the analog signal outputted to the column signal line 508 into a digital signal as soon as possible. Unfortunately, a certain time is required to stabilize, to an original voltage level, the varying bias voltage φLC caused by the coupling through the parasitic capacitance Cgd. Accordingly, for example, if the analog-to-digital conversion is performed at a time when the bias voltage φLC is not stabilized, e.g. at the time T6, the potential of the column signal line 508 is lower than the level of the original optical signal, thereby resulting in a digital pixel signal output having a value higher than a true value.

In particular, under the condition where a relatively bright region is present only in a part of an object, whitish streaks which are called "streak noise" appear on both sides of the bright region in the object. In order to prevent the streak noise, the analog-to-digital conversion should be performed at a time when the bias voltage φLC is adequately stabilized, as represented by the time T6'. This, however, cannot fully provide the advantage of the originally-intended high-speed transmission.

In contrast, the enhancement of current capability of the bias generator 503 is considered as a method of rapidly stabilizing the varying bias voltage φLC caused by the coupling with the column signal line 508. Unfortunately, this case involves increases in chip size and power consumption, and thus it is difficult to achieve both the low noise and the high-speed transmission in the column signal line 508 at a high level at the same time while maintaining the small size and low power consumption.

<Behavior of Solid-State Imaging Device Acceding to Embodiment>

The following describes the behavior of the solid-state imaging device 1 according to the present embodiment until an optical signal is read out.

Figure 6:
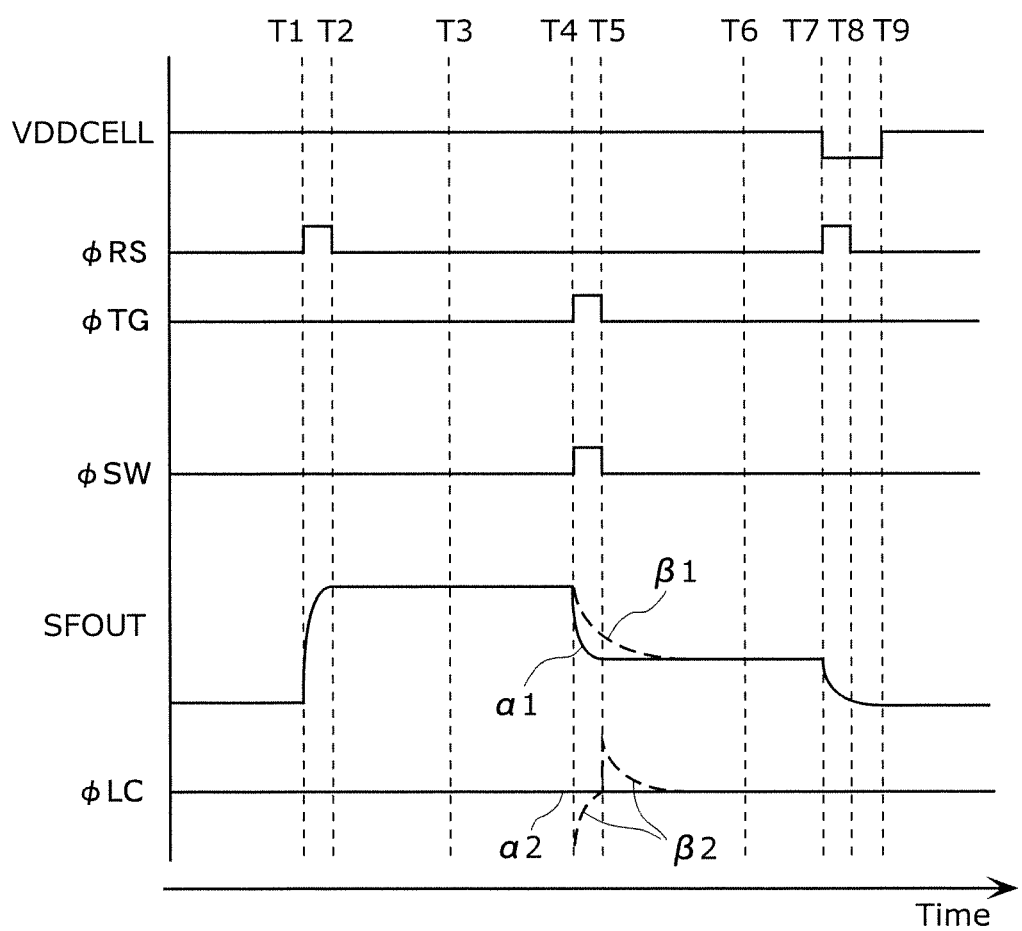
FIG. 6 illustrates a timing chart showing the behavior of the solid-state imaging device according to the embodiment.

FIG. 6 illustrates a timing chart showing the behavior of the solid-state imaging device according to the embodiment. In FIG. 6, VDDCELL denotes a supply voltage applied to the drains of the reset transistor 403 and the amplifier transistor 404 in the pixel 100. Furthermore, φRS denotes a voltage level of a signal provided to the gate of the reset transistor 403 in the pixel 100. Furthermore, φTG denotes a voltage level of a signal provided to the gate of the transfer transistor 402 in the pixel 100. Furthermore, SFOUT denotes a potential of the column signal line 108. Furthermore, φSW denotes a voltage level of a signal provided to the gate of the transistor M5y in the current source 105.

First, at the time T1, the row selector 102 changes the reset signal φRS from the "L" level to the "H" level. Accordingly, the reset transistor 403 turns on, and the potential of the FD 401 is set to a predetermined value. Then, a reset pixel signal corresponding to the predetermined value is outputted as the analog signal SFOUT.

Next, at the time T3, the AD converter 106 captures the reset pixel signal.

Next, during a period between the time T4 and the time T5, the row selector 102 turns on the transfer transistor 402 by changing the transfer signal φTG from the "L" level to the "H" level. Accordingly, signal charge corresponding to an amount of light received by the photo diode 400 is transferred from the photo diode 400 to the FD 401. Then, the optical signal (an imaging signal) according to the resultant potential of the FD 401 is outputted as the analog signal SFOUT.

Furthermore, at the time T4, the timing controller 104 provides the control signal φSW having a predetermined voltage level to the gate of the transistor M5y in a form of a pulse to turn on the transistor M5y. Accordingly, the transistor M3y is short-circuited between the source and the drain thereof. In other words, the timing controller 104 provides the control signal φSW for allowing conduction between the source and drain of the transistor M5y to the gate of the transistor M5y at a time when the analog signal is outputted to the column signal line 108-y. As a result, an amount of current flowing through the column signal line 108-y is increased, and the analog signal SFOUT representing the potential of the column signal line 108-y is rapidly changed to a potential according to the optical signal (the curve α1 in FIG. 6). In contrast, in the configuration without the transistor M5y, the change in the potential of the analog signal SFOUT is slow (the curve β1 in FIG. 6).

Furthermore, in the case of the general solid-state imaging device as shown in FIG. 4, the bias voltage φLC is dropped at the time T4, and raised at the time T5 (the curves β2 in FIG. 6). The varying bias voltage φLC after the time T4 means that the high-speed transmission in the column signal line 108-y cannot be achieved even if the current flowing through the column signal line 108-y is increased by means of the control signal φSW to control the waveform of the potential of the column signal line 108-y.

In contrast, the solid-state imaging device 1 according to the present embodiment provides stabilization of the bias voltage φLC after the time T4 to achieve the high-speed transmission in the column signal line 108-y. This is described below.

Figure 7:
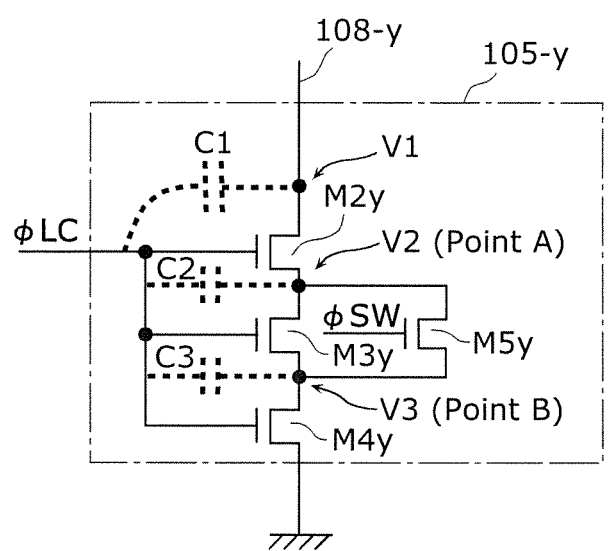
FIG. 7 illustrates a circuit diagram of a column current source included in the solid-state imaging device according to the embodiment.

FIG. 7 illustrates a circuit diagram of the column current source included in the solid-state imaging device according to the embodiment. Referring to this drawing, the waveform of the bias voltage φLC according to the present embodiment is described. As shown in FIG. 7, the column current source 105-y includes at least three transistors M2y, M3y, and M4y which are connected in series, and a transistor M5y connected at two common connection points of these series-connected transistors (point A and point B in FIG. 7).

In this configuration, the column signal line 108-y (the drain of the transistor M2y) and a bias line transmitting the bias voltage φLC are coupled through parasitic capacitance C1. Furthermore, the common connection point A (a point connecting the source implemented as the fourth terminal of the transistor M2y and the drain implemented as the third terminal of the transistor M3y) and the bias line are coupled through parasitic capacitance C2. Furthermore, the common connection point B (a point connecting the source implemented as the fourth terminal of the transistor M3y and the drain implemented as the third terminal of the transistor M4y) and the bias line are coupled through parasitic capacitance C3. In FIG. 7, the drain voltages of the transistors M2y, M3y, and M4y are defined as V1, V2, and V3, respectively.

At the time T4, the transfer signal φTG is changed to the "H" level. This causes a change in the gate-source voltage of the amplifier transistor 404 in the pixel 100, and thus the voltage V1 is dropped. At the same time, the control signal φSW is also changed to the "H" level. Accordingly, the transistor M5y is turned on to short-circuit the transistor M3y between the source and the drain thereof, and thus the voltage V2 is also dropped.

On the other hand, in the transistor M4y, a difference in potential between the source and the drain is increased by an increase in current, and thus the voltage V3 is raised. The change in the voltage V1 and the change in the voltage V2 cause a drop in the bias voltage φLC of the bias line through the parasitic capacitance C1 and the parasitic capacitance C2, respectively. On the other hand, the change in the voltage V3 causes a raise in the bias voltage φLC of the bias line through the parasitic capacitance C3.

Accordingly, at the time T4, a factor causing a drop in the bias voltage φLC and a factor causing a raise in the bias voltage φLC are concurrently present in the column current source 105-y due to the configuration and the on/off timing of each of the transistors. By using these concurrent factors, it is possible to cancel the variation in the bias voltage φLC by optimally designing the sizes of the transistors M2y, M3y, and M4y.

Furthermore, at the time T5, the transfer signal φTG and the control signal φSW are changed to the "L" level, and thus the voltages V1 and V2 are increased. The change in the voltage V1 and the change in the voltage V2 cause a raise in the bias voltage φLC through the parasitic capacitance C1 and the parasitic capacitance C2, respectively. On the other hand, in the transistor M4y, a difference in potential between the source and the drain is decreased by a decrease in current, and thus the voltage V3 is dropped. The change in the voltage V3 causes a drop in the bias voltage φLC through the parasitic capacitance C3. Accordingly, in the column current source 105-y, it is possible to cancel the variation in the bias voltage φLC at the time T5 due to the configuration and the on/off timing of each of the transistors.

In other words, in the solid-state imaging device according to the present embodiment, the transistor M3y, which is the middle one of the three transistors M2y, M3y, and M4y connected in series and included in the column current source 105-y, is short-circuited at a time when the analog signal is outputted from the pixel 100 to the column signal line 108-y. Accordingly, the amount of current flowing through the column signal line 108-y is increased, and the potential of the column signal line 108-y is rapidly changed to a potential according to the analog signal. Due to the parasitic capacitance formed between each of the transistors M2y, M3y, and M4y and the bias line transmitting the bias voltage φLC to the gates of the transistors M2y, M3y, and M4y, the factor causing a drop in the bias voltage φLC and the factor causing a raise in the bias voltage φLC are concurrently present at a time when the analog signal is outputted from the pixel 100 to the column signal line 108-y. By using these concurrent factors, it is possible to cancel the variation in the bias voltage φLC. Thus, the high-speed transmission in the column signal line can be achieved while suppressing the bias noise. Accordingly, it is possible to achieve both the high frame rate and the low noise at the same time. Furthermore, at a time when the pixel signal is outputted from the pixel to the column signal line, an increase in the amount of current flowing through the column signal line is temporary, and thus an increase in power consumption can be minimized.

It is to be noted that the solid-state imaging device 1 according to the present embodiment shows three series-connected transistors included in the column current source, but even if the column current source includes at least four series-connected transistors, this case also provides the same advantages as the solid-state imaging device 1 disclosed herein.

<Variation>

Figure 8:
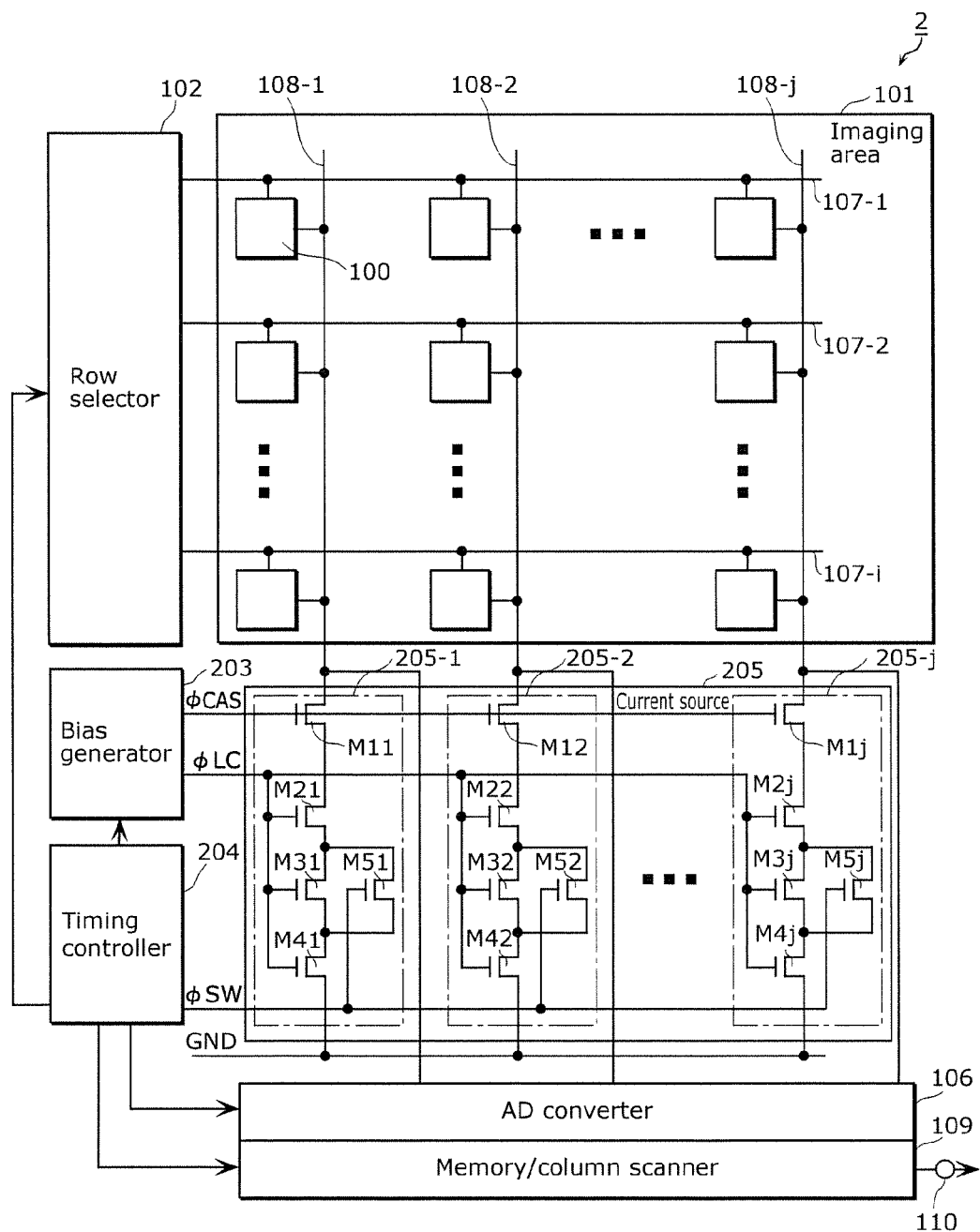
FIG. 8 illustrates a functional block diagram showing an overall configuration of a solid-state imaging device according to a variation of the embodiment.

FIG. 8 illustrates a functional block diagram showing an overall configuration of a solid-state imaging device according to a variation of the embodiment. In a solid-state imaging device 2 according to the present variation, a transistor M1y (1≤y≤j) included in the column current source is added to the configuration of the solid-state imaging device 1 as shown in FIG. 1. The following describes only differences from the solid-state imaging device 1, and the detailed description of the same is omitted.

As shown in FIG. 8, the solid-state imaging device 2 includes: an imaging area 101 having pixels 100 arranged in a matrix of i rows and j columns (each of i and j is a given natural number); a row selector 102; a bias generator 203; a timing controller 204; a current source 205; an AD converter 106; a memory/column scanner 109; and an external output terminal 110. The current source 205 includes column current sources 205-1 to 205-j provided in the respective columns.

The column current sources 205-1 to 205-j are connected to the column signal lines 108-1 to 108-j to drive currents of the column signal lines 108-1 to 108-j, respectively. All of the column current sources 205-1 to 205-j have the same configuration.

Each of the column current sources includes five transistors. The column current source 205-y disposed in the y-th column (1≤y≤j) includes transistors M1y, M2y, M3y, M4y, and M5y.

The transistor M1y has the drain connected to the column signal line 108-y, the source connected to the drain of the transistor M2y, and the gate connected to the second bias line transmitting a bias voltage φCAS provided from the bias generator 203. In other words, the transistor M1y is the third transistor disposed in series between the column signal line 108-y and the transistors M2y, M3y, and M4y.

A predetermined bias voltage is applied to the gate terminal of the transistor M1y which is the third transistor. In other words, a bias voltage φCAS is applied to the transistor M1y (the third transistor), and thus a grounded gate configuration is formed in which a certain voltage (but not limited to a ground potential) is applied to the gate of the transistor M1y.

The transistors M2y, M3y, and M4y are connected in series in this order between the transistor M1y and a GND line, and the transistor M5y is connected in parallel to the transistor M3y. A bias voltage φLC is applied to the gates of the transistors M2y, M3y, and M4y through the bias line. A control signal φSW is applied to the gate of the transistor M5y. When the control signal φSW becomes the "H" level, the transistor M5y turns ON. Accordingly, the transistor M3y is short-circuited between the source and the drain thereof, thereby increasing the current flowing through the column signal line 108-y.

The bias generator 203 provides the bias voltage φLC to the transistors M2y, M3y, and M4y, and the bias voltage φCAS to the transistor M1y. Furthermore, at a time when an analog signal is outputted from the pixel 100 to the column signal line 108-y, the timing controller 204 provides the control signal φSW having a predetermined voltage level to the gate of the transistor M5y in a form of a pulse to turn on the transistor M5y. Accordingly, the transistor M3y is short-circuited between the source and the drain thereof. As a result, an amount of current flowing through the column signal line 108-y is increased, and the analog signal SFOUT representing the potential of the column signal line 108-y is rapidly changed to a potential according to the optical signal.

Figure 9:
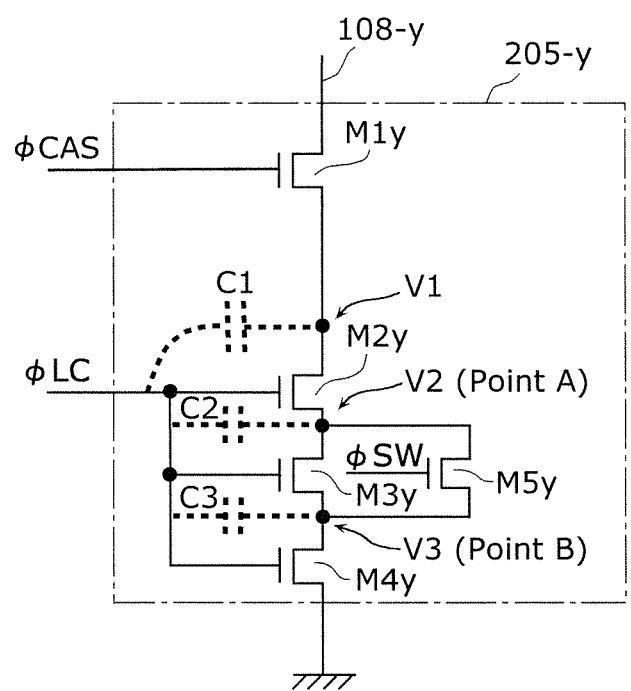
FIG. 9 illustrates a circuit diagram of a column current source included in the solid-state imaging device according to the variation of the embodiment.

FIG. 9 illustrates a circuit diagram of a column current source included in the solid-state imaging device according to the variation of the embodiment. In the configuration of the column current source 205-y as shown in FIG. 9, the drain of the transistor M2y and the bias line are coupled through parasitic capacitance C1. Furthermore, a common connection point A (a point connecting the source of the transistor M2y and the drain of the transistor M3y) and the bias line are coupled through parasitic capacitance C2. Furthermore, a common connection point B (a point connecting the source of the transistor M3y and the drain of the transistor M4y) and the bias line are coupled through parasitic capacitance C3. In FIG. 9, the drain voltages of the transistors M2y, M3y, and M4y are defined as V1, V2, and V3, respectively.

As described above, at a time when the analog signal is outputted from the pixel 100 to the column signal line 108-y, the bias generator 203 provides, to the gate of the transistor M5y, the control signal φSW which is a pulse. At this time, due to the transistor M1y disposed between the column signal line 108-y and the transistor M2y, the variation in the voltage V1 caused by an increase in current flowing through the column signal line 108-y is smaller than that of the solid-state imaging device 1 according to the embodiment. In addition to this, the variation in voltage V2 and the variation in voltage V3 cancel out each other, and thus it is possible to further restrict the propagation of the variations to the bias voltage φLC.

As can be seen from the above, each of the solid-state imaging devices 1 and 2 according to the present embodiment has: three series-connected transistors included in the current source of the column signal line 108-y; and another transistor disposed in parallel to the middle one of the three transistors. The solid-state imaging devices 1 and 2 according to the present embodiment not only provide such a simple configuration, but also achieve the high-speed transmission in the column signal line without increasing power consumption and while suppressing noise. Accordingly, the solid-state imaging device according to the embodiment achieves both the high frame rate and the low noise at a higher level at the same time.

As described above, the solid-state imaging device disclosed herein have been described based on the embodiment, but is not limited to the embodiment and its variation. Those skilled in the art will be readily appreciated that various modifications and combinations of the structural elements are possible in the embodiment without departing from the scope of the present invention. Such modifications and combinations are also embodiments of the present disclosure. For example, an imaging device in which the solid-state imaging device according to the present disclosure is embedded is also included in the present invention.

It is to be noted that, in the embodiment, each of transistors is described as an n-type FET having a gate, a source, and a drain, but these transistors may be implemented as p-type FETs. Furthermore, each transistor may be implemented as a bipolar transistor having a base, a collector, and an emitter. Such cases also provide the same advantages as the solid-state imaging devices 1 and 2 disclosed herein.

INDUSTRIAL APPLICABILITY

One or more exemplary embodiments disclosed herein are useful for solid-state imaging devices, particularly for use in high-speed and high-quality camera such as mobile cameras (smartphones), monitoring cameras, cameras for medical use, digital still cameras, and digital video cameras.

The invention claimed is:
1. A solid-state imaging device comprising:
an imaging unit including a plurality of pixels arranged in rows and columns, each of the plurality of pixels converting incident light into a pixel signal;
a plurality of column signal lines, each of which is provided for a different one of the columns, for reading out the pixel signal;
a current source connected to the plurality of column signal lines, the current source including a plurality of column current sources, each of which is provided for a different one of the plurality of column signal lines, each of the plurality of column current sources including:
a plurality of first transistors connected in series and provided between one of the plurality of column signal lines and a reference potential line, the plurality of first transistors comprising at least three first transistors and each having a gate terminal to which a predetermined bias voltage is applied; and
a second transistor connected in parallel between two different connection points among connection points connecting adjacent ones of the plurality of first transistors, and having a gate terminal to which a control signal, which is different from the bias voltage, is connected, the control signal controlling an on/off state of the second transistor; and
wherein the solid-state imaging device further includes a timing controller that provides the control signal, for allowing conduction of the second transistor, to the gate terminal of the second transistor in each of the plurality of column current sources at a time when the pixel signal is outputted to one of the plurality of column signal lines.

2. The solid-state imaging device according to claim 1, wherein each of the plurality of column current sources further includes:
a third transistor disposed in series between the column signal line and the plurality of first transistors,
the third transistor having a gate terminal to which a predetermined bias voltage, which is different from the bias voltage applied to the gate terminal of the first transistor, is applied.

3. The solid-state imaging device according to claim 1, wherein each of the plurality of first transistors has a third terminal, a fourth terminal, and a second control terminal for controlling conduction between the third terminal and the fourth terminal, and
the solid-state imaging device further includes:
a bias generator that provides a predetermined bias voltage to the second control terminal of each of the plurality of first transistors of each of the plurality of column current sources; and
a bias line connecting the bias generator and the second control terminal of each of the plurality of first transistors of each of the plurality of column current sources.

4. The solid-state imaging device according to claim 1, wherein each of the plurality of pixels includes:
a photoelectric conversion unit configured to convert the incident light into signal charge;
a transfer transistor that transfers the signal charge generated in the photoelectric conversion unit;
a charge accumulation unit configured to accumulate the signal charge transferred by the transfer transistor;
a reset transistor that allows discharge of the signal charge accumulated in the charge accumulation unit; and
an amplifier transistor that converts the signal charge accumulated in the charge accumulation unit into a voltage and provides the voltage to a corresponding one of the plurality of column signal lines as the pixel signal.

5. The solid-state imaging device according to claim 1, further comprising:
a bias generator that generates a bias voltage to be provided to the gate terminal of each of the plurality of first transistors of each of the plurality of column current sources; and a bias line connecting the bias generator and the gate terminal of each of the plurality of first transistors of each of the plurality of column current sources.

6. The solid-state imaging device according to claim 2, further comprising:
- a bias generator that generates a bias voltage to be provided to the gate terminal of each of the plurality of first transistors of each of the plurality of column current sources, and a bias voltage to be provided to the gate terminal of the third transistor of each of the plurality of column current sources; and
- a bias line connecting the bias generator and the gate terminal of each of the plurality of first transistors of each of the plurality of column current sources, and a bias line connecting the bias generator and the gate terminal of the third transistor of each of the plurality of column current sources.

\* \* \* \* \*